US012683264B2

(12) United States Patent
Kim et al.

(10) Patent No.: US 12,683,264 B2
(45) Date of Patent: Jul. 14, 2026

(54) HEAT DISSIPATION APPARATUS AND ANTENNA ASSEMBLY USING THE SAME

(71) Applicant: KMW INC., Hwaseong-si (KR)

(72) Inventors: Duk Yong Kim, Yongin-si (KR); Kyu Chul Choi, Hwaseong-si (KR); In Hwa Choi, Yongin-si (KR); Youn Jun Cho, Hwaseong-si (KR); Jae Hyun Park, Hwaseong-si (KR); Kyo Sung Ji, Hwaseong-si (KR); Hye Yeon Kim, Hwaseong-si (KR); Chi Back Ryu, Hwaseong-si (KR); Jeong Hyun Choi, Hwaseong-si (KR); Jae Ho Jang, Pohang-si (KR)

(73) Assignee: KMW INC., Hwaseong-si (KR)

( * ) Notice: Subject to any disclaimer, the term of this patent is extended or adjusted under 35 U.S.C. 154(b) by 118 days.

(21) Appl. No.: 17/975,621

(22) Filed: Oct. 28, 2022

(65) Prior Publication Data

US 2023/0047942 A1 Feb. 16, 2023

Related U.S. Application Data

(63) Continuation of application No. PCT/KR2021/005245, filed on Apr. 26, 2021.

(30) Foreign Application Priority Data

Apr. 29, 2020 (KR) ........................ 10-2020-0052808

(51) Int. Cl.
H05K 7/20 (2006.01)
H01Q 1/02 (2006.01)
H01Q 1/24 (2006.01)

(52) U.S. Cl.
CPC .............. H01Q 1/02 (2013.01); H01Q 1/246 (2013.01); H05K 7/20145 (2013.01); H05K 7/20154 (2013.01)

(58) Field of Classification Search
CPC ...... H01Q 1/02; H01Q 1/246; H05K 7/20145; H05K 7/20154
(Continued)

(56) References Cited

U.S. PATENT DOCUMENTS 5,155,579 A * 10/1992 AuYeung ............ H01L 23/3675
174/16.3
5,706,169 A 1/1998 Yeh
(Continued)

FOREIGN PATENT DOCUMENTS

CN        201489433 U      5/2010
CN        209330512 U      8/2019
(Continued)

OTHER PUBLICATIONS

Non-final Office Action mailed Dec. 5, 2023 from the Japanese Patent Office for Japanese Application No. 2022-566194 and its English translation.
(Continued)

*Primary Examiner* — Anatoly Vortman

(57) ABSTRACT

A heat dissipation apparatus and antenna assembly using the same is disclosed herein. According to an embodiment of the present disclosure, a heat dissipation apparatus configured to cool a circuit board including at least one heat generation element is provided, the heat dissipation apparatus including: a plate disposed to face the circuit board; a plurality of first heat dissipation fins disposed in a first direction on one surface of the plate spaced apart from the circuit board; and a blowing unit disposed to face the one surface of the plate, the blowing unit including at least one fan configured to discharge air toward the one surface of the plate, wherein a space between two adjacent first heat dissipation fins defines a side flow path configured to guide the air discharged from the at least one fan.

17 Claims, 12 Drawing Sheets

(58) Field of Classification Search
USPC ...................................................... 361/679.46
See application file for complete search history.

(56) References Cited

U.S. PATENT DOCUMENTS

| | | | | |
|---|---|---|---|---|
| 8,004,844 B2 * | 8/2011 | Kim | .................... | H05K 7/20163 |
| | | | | 361/728 |
| 8,422,232 B2 * | 4/2013 | Kwak | ...................... | H01Q 1/42 |
| | | | | 361/709 |
| 8,827,508 B2 * | 9/2014 | Sagal | ...................... | B29C 45/14 |
| | | | | 362/373 |
| 10,784,589 B2 * | 9/2020 | Toyao | .................. | H01Q 21/062 |
| 11,324,106 B2 * | 5/2022 | Kim | ......................... | H05K 1/18 |
| 2004/0218362 A1 * | 11/2004 | Amaro | ............... | H05K 7/20409 |
| | | | | 361/679.54 |
| 2005/0168941 A1 * | 8/2005 | Sokol | ................. | H05K 7/20445 |
| | | | | 361/688 |
| 2006/0164808 A1 | 7/2006 | Stefanoski | | |
| 2011/0116230 A1 * | 5/2011 | Kwak | ...................... | H01Q 1/42 |
| | | | | 361/688 |
| 2012/0262878 A1 * | 10/2012 | Ikeda | ........................ | G06F 1/20 |
| | | | | 361/720 |
| 2013/0016473 A1 * | 1/2013 | Ito | ............................. | B08B 1/12 |
| | | | | 361/679.54 |
| 2014/0362523 A1 * | 12/2014 | Degner | ............. | H05K 7/20163 |
| | | | | 361/679.47 |
| 2015/0271950 A1 * | 9/2015 | Hagiwara | .............. | H05K 7/206 |
| | | | | 174/547 |
| 2015/0382504 A1 * | 12/2015 | Hu | ...................... | H05K 7/20163 |
| | | | | 361/697 |
| 2018/0358710 A1 * | 12/2018 | Toyao | .................. | H01Q 15/148 |
| 2020/0305270 A1 * | 9/2020 | Kim | ......................... | H05K 1/18 |

FOREIGN PATENT DOCUMENTS

| | | | |
|---|---|---|---|
| JP | H06-104586 A | 4/1994 |
| JP | H09-83166 A | 3/1997 |
| JP | 10-065374 A | 3/1998 |
| JP | 11-135970 A | 5/1999 |
| JP | 2019-036694 A | 3/2019 |
| KR | 10-1880478 B1 | 7/2018 |

OTHER PUBLICATIONS

International Search Report mailed Aug. 12, 2021 for International Application No. PCT /KR2021/005245 and its English translation.
European Search Report dated Jun. 3, 2024 for the Application No. 21795907.1.
Chinese Office Action mailed on Aug. 1, 2025 from the Chinese Patent Office for Chinese Application No. 202180031981.4 and its English translation.

* cited by examiner

<u>10</u>

HEAT DISSIPATION APPARATUS AND ANTENNA ASSEMBLY USING THE SAME

CROSS-REFERENCE TO RELATED APPLICATION

This application is a continuation application of International Application No. PCT/KR2021/005245, filed Apr. 26, 2021, which claims priority to Patent Application No. 10-2020-0052808, filed on Apr. 29, 2020 in Korea, the entire contents of which are incorporated herein by reference.

BACKGROUND OF THE PRESENT DISCLOSURE

Field of the Present Disclosure

The present disclosure relates to heat dissipation apparatus and antenna assembly using the same.

Description of Related Art

The content described herein merely provides background information for the present disclosure and does not constitute the related art.

In an antenna apparatus of the related art, a convection cooling scheme using heat dissipation fins and fans is used to cool heat generation elements such as RF elements. Specifically, the convection cooling scheme of the related art is a scheme of extending the heat dissipation fins in a longitudinal direction and disposing the fans above the heat dissipation fins or under the heat dissipation fins to cool the heat dissipation fins.

However, this convection cooling scheme of the related art has a problem that a traveling distance of air flowing between the heat dissipation fins inevitably becomes longer, and thus, cooling efficiency is degraded.

For example, when it is assumed that the fans are disposed under the heat dissipation fins, air discharged from the fans cools lower regions of the heat dissipation fins and then cools upper regions of the heat dissipation fins. In this case, some of the flowing air may leak to the outside, such that an amount of air transferred to the upper regions of the heat dissipation fins can be smaller than that to the lower regions of the heat dissipation fins.

Furthermore, the air transferred to the upper regions of the heat dissipation fins may already be in a high temperature state because the air has already been heated by the other regions of the heat dissipation fins. Therefore, the convection cooling scheme of the related art has a problem that not only overall cooling efficiency is degraded, but also a difference in cooling performance is great between respective regions of the heat dissipation fin.

BRIEF SUMMARY

Therefore, an object of the present disclosure is to provide a heat dissipation apparatus capable of effectively cooling heat generation elements through convection and an antenna assembly using the same.

According to an embodiment of the present disclosure, a heat dissipation apparatus configured to cool a circuit board including at least one heat generation element is provided, the heat dissipation apparatus including: a plate disposed to face the circuit board; a plurality of first heat dissipation fins disposed in a first direction on one surface of the plate spaced apart from the circuit board; and a blowing unit disposed to face the one surface of the plate, the blowing unit including at least one fan configured to discharge air toward the one surface of the plate, wherein a space between two adjacent first heat dissipation fins defines a side flow path configured to guide the air discharged from the at least one fan.

As described above, with the heat dissipation apparatus and the antenna assembly using the same according to the present embodiment, it is possible to minimize problems that may occur in a high temperature state of the heat generation element, such as deterioration in performance of the heat generation element, damage to the heat generation element, and the like by effectively cooling the heat generation element.

Figure 1:
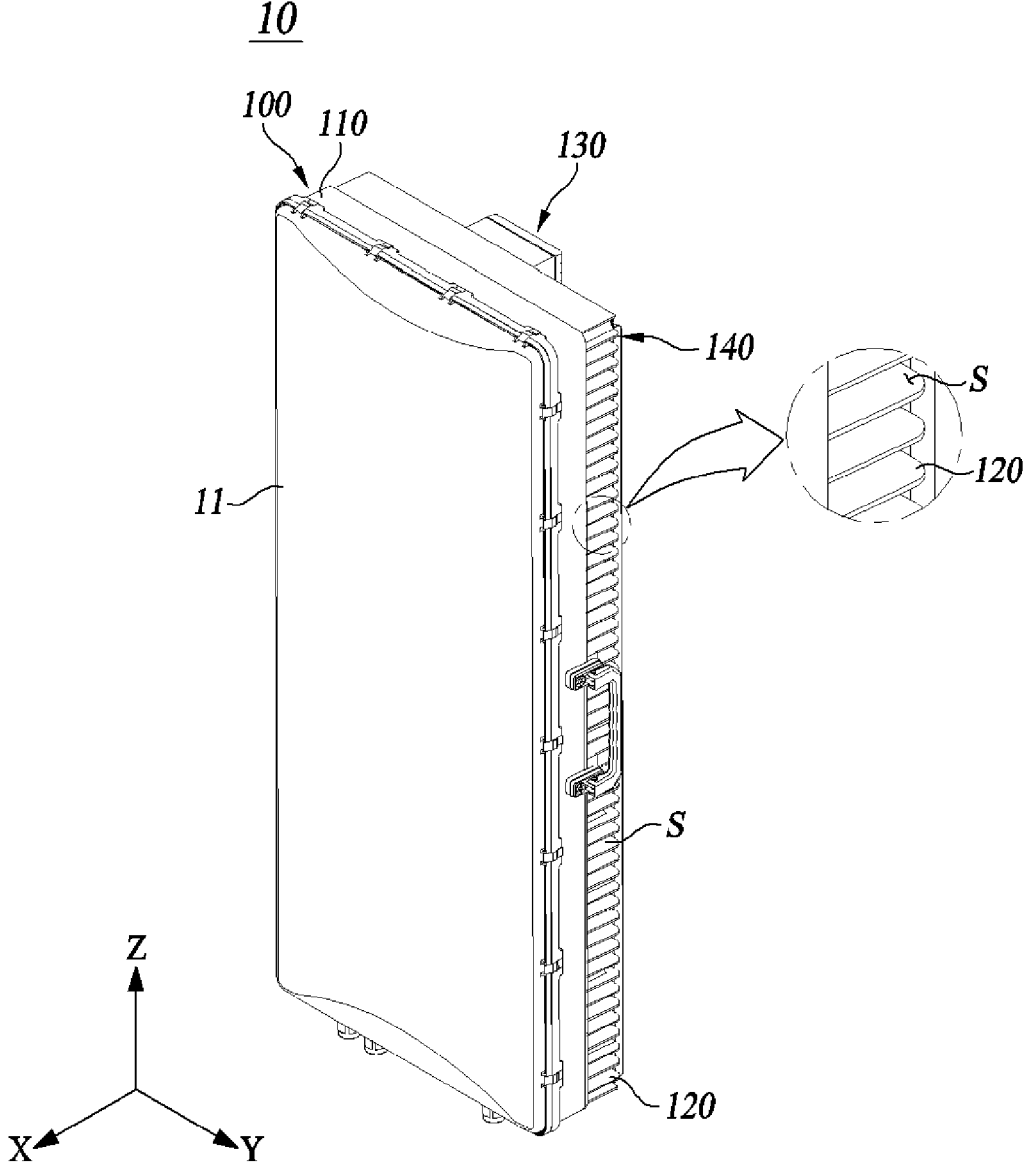
FIG. 1 is a perspective view of an antenna assembly according to an embodiment of the present disclosure.

| REFERENCE NUMERALS |
| --- |
| 10: Antenna assembly |
| 12: Circuit board |
| 13: Heat generation element |
| 100: Heat dissipation apparatus |
| 110: Plate |
| 120: First heat dissipation fins |
| 130: Blowing unit |
| 140: Duct unit |
| 222: First side heat dissipation fins |
| 224: Second side heat dissipation fins |
| 350: Second heat dissipation fins |
| 460: Protrusions |
| 5362: First fans |
| 5364: Second fans |
| 6466: Third fans |
| 6368: Fourth fans |
| S: Side flow path |
| C: Intermediate flow path |
| C1: Sub flow path |
| C2: Main flow path |

DETAILED DESCRIPTION

Hereinafter, some exemplary embodiments of the present disclosure will be described in detail with reference to the accompanying drawings. In the following description, like reference numerals preferably designate like elements, although the elements are shown in different drawings. Further, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout this specification, when a part 'includes' or 'comprises' a component, the part is meant to further include other components, not to exclude thereof unless specifically stated to the contrary. The terms such as 'unit', 'module', and the like refer to one or more units for processing at least one function or operation, which may be implemented by hardware, software, or a combination thereof.

FIG. 1 is a perspective view of an antenna assembly 10 according to an embodiment of the present disclosure.

Figure 2:
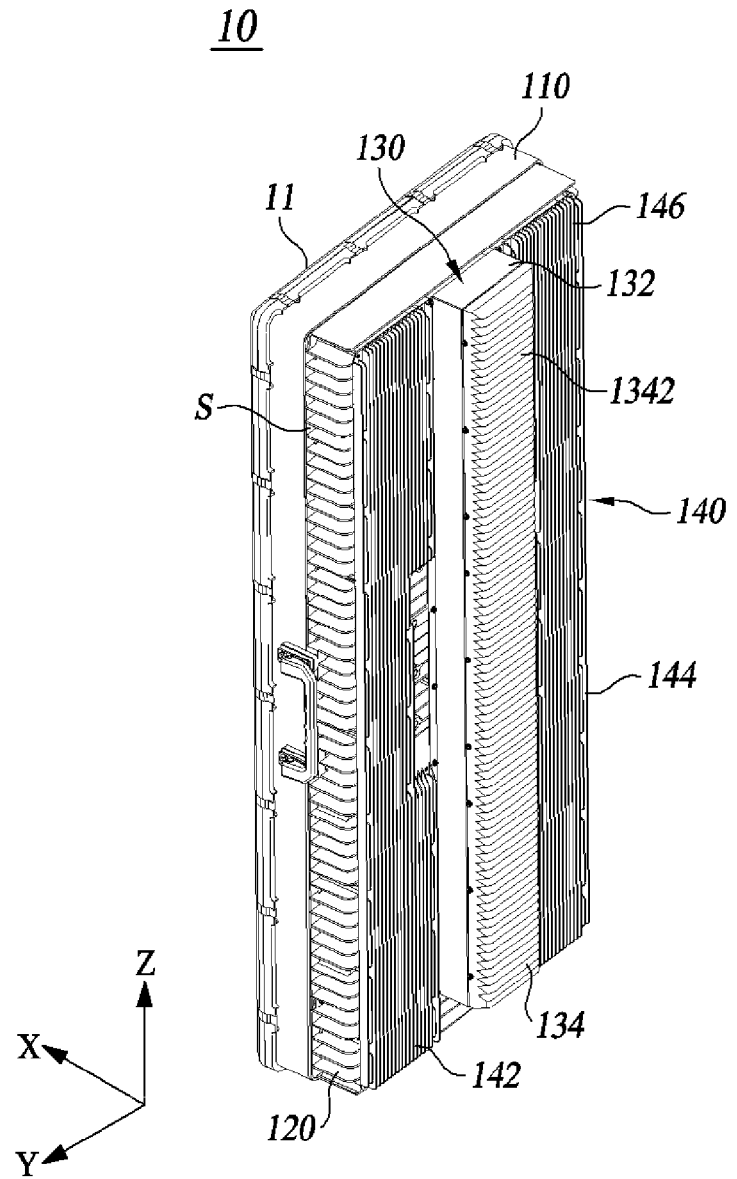
FIG. 2 is a rear perspective view of the antenna assembly according to the embodiment of the present disclosure.

FIG. 2 is a rear perspective view of the antenna assembly 10 according to the embodiment of the present disclosure.

Figure 3:
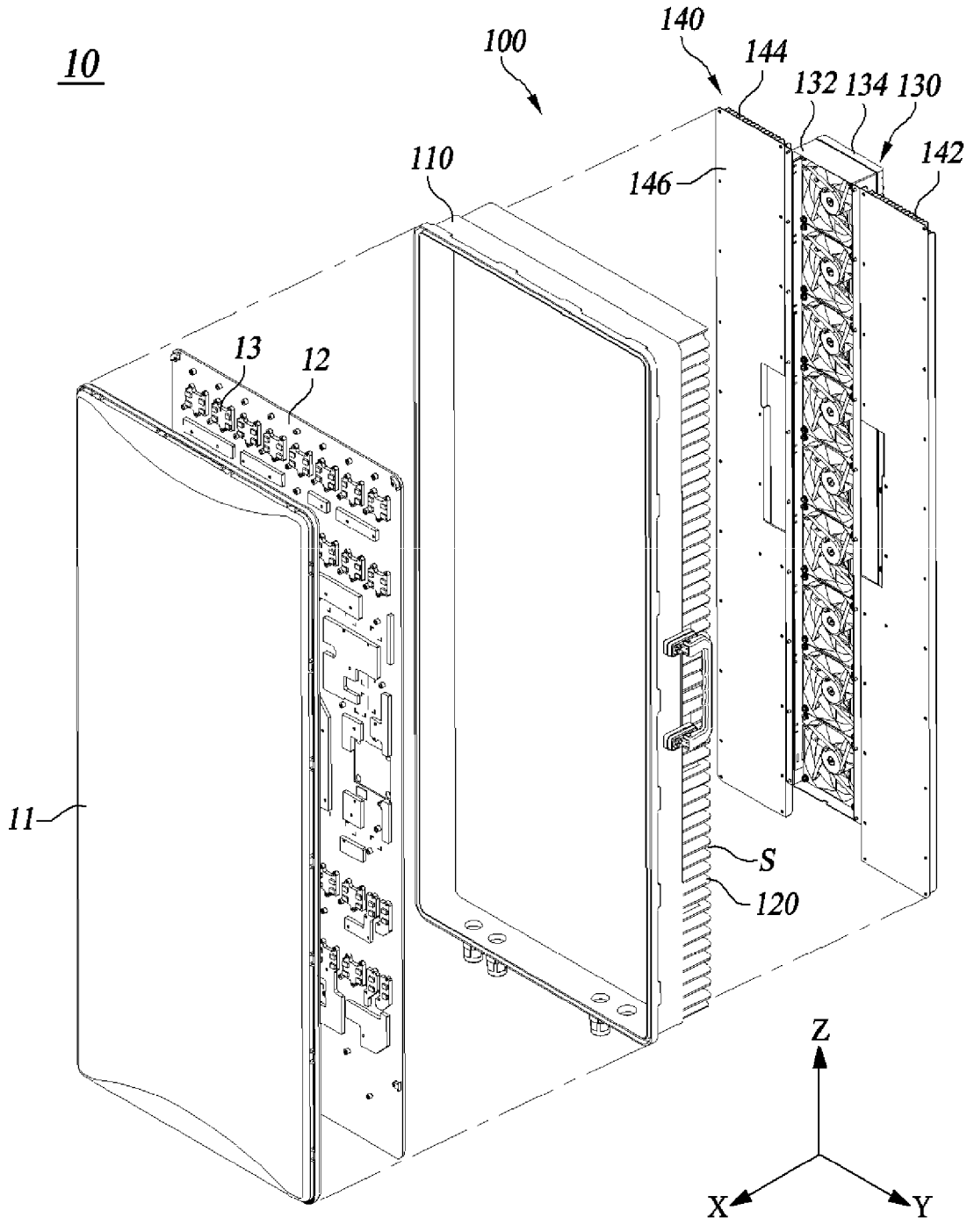
FIG. 3 is an exploded perspective view of the antenna assembly according to the embodiment of the present disclosure.

FIG. 3 is an exploded perspective view of the antenna assembly 10 according to the embodiment of the present disclosure.

Figure 4:
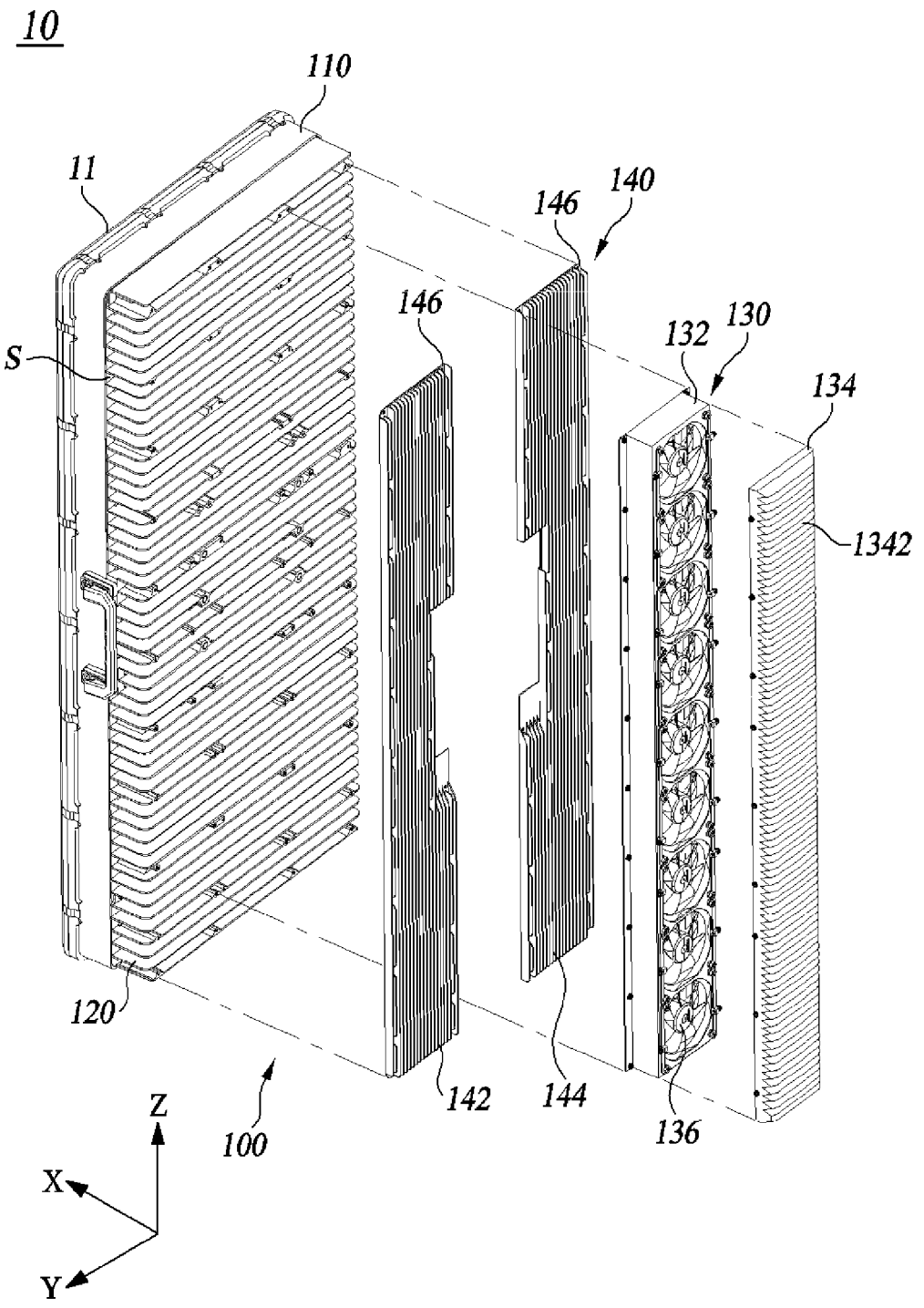
FIG. 4 is a rear exploded perspective view of the antenna assembly according to the embodiment of the present disclosure.

FIG. 4 is a rear exploded perspective view of the antenna assembly 10 according to the embodiment of the present disclosure.

Figure 5:
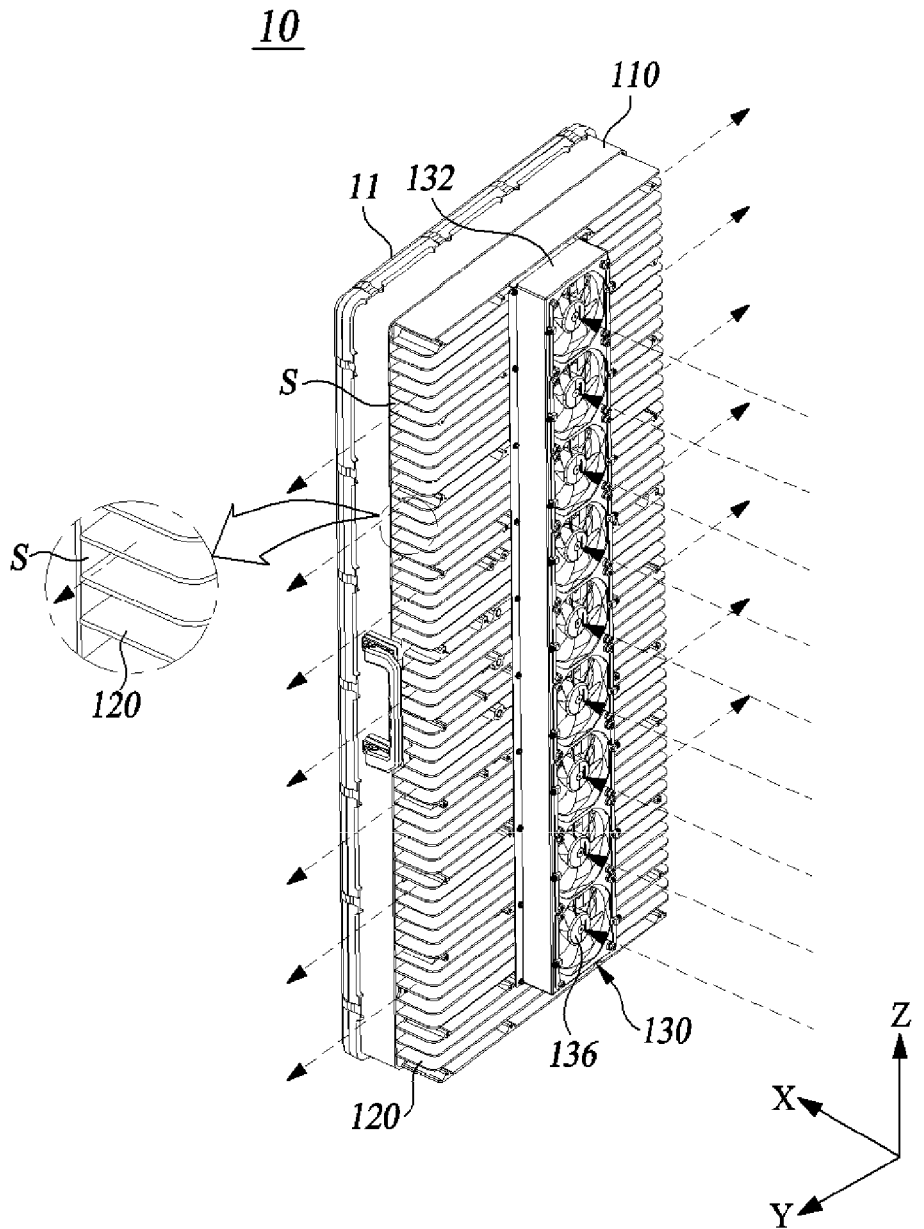
FIG. 5 is a rear perspective view illustrating that air flows along side flow paths in the antenna assembly according to the embodiment of the present disclosure.

FIG. 5 is a rear perspective view illustrating that air flows along side flow paths S in the antenna assembly 10 according to the embodiment of the present disclosure.

Referring to FIGS. 1 to 4, the antenna assembly 10 may include a radome 11, a circuit board 12, and a heat dissipation apparatus 100.

The radome 11 may be disposed on a front surface of the antenna assembly 10. This makes it possible for the radome 11 to protect electrical elements inside the antenna assembly 10 from an external shock or inflow of foreign substances.

The circuit board 12 may include at least one heat generation element 13. The at least one heat generation element 13 may include all or some of RF elements for operation of the antenna assembly 10, such as an amplifier, a filter, and an FPGA, but the present disclosure is not limited thereto.

The heat dissipation apparatus 100 may be disposed adjacent to the circuit board 12 to cool heat generated from the heat generation element 13 of the circuit board 12. Accordingly, a temperature of the heat generation element 13 can be maintained within an appropriate range, thereby preventing a function of the heat generation element 13 from deteriorating or the heat generation element 13 from being damaged due to a high temperature.

The heat dissipation apparatus 100 may be disposed adjacent to the circuit board 12. For example, the heat dissipation apparatus 100 may be disposed behind the circuit board 12 or may be disposed to surround at least a portion of the circuit board 12.

The heat dissipation apparatus 100 may include all or some of a plate 110, a plurality of first heat dissipation fins 120, and a blowing unit 130.

The plate 110 may be disposed to face the circuit board 12. The heat generated from the heat generation element 13 may be transferred to the plate 110.

The plate 110 may be in direct contact with the circuit board 12. In this case, the heat generated from the heat generation element 13 may be transferred to the plate 110 through heat conduction.

However, the present disclosure is not limited thereto, and the plate 110 may be spaced slightly apart from the circuit board 12. In this case, the heat generated from the heat generation element 13 may be transferred to the plate 110 through convection.

Meanwhile, a heat conduction portion (not illustrated) may be included between the plate 110 and the circuit board 12. The heat conduction portion may be made of a metal having high heat conductivity, such as aluminum.

The heat generated from the heat generation element 13 may be locally generated only in a region around the heat generation element 13. The heat conduction portion may evenly spread the heat generated locally from the heat generation element 13 to an entire region of the heat conduction portion through heat conduction.

In this case, heat generated from one heat generation element 13 may be transferred to a wider region of the plate 110 via the heat conduction portion. This makes it possible to cool the heat generated from the heat generation element 13 more effectively.

The plate 110 may have a plate shape or may have a case shape that forms at least a portion of an outer shape of the antenna assembly 10. However, the present disclosure is not limited thereto, and the plate 110 may have any shape necessary to remove the heat generated from the heat generation element 13.

The plurality of first heat dissipation fins 120 may be disposed on one surface of the plate 110 spaced apart from the circuit board 12, for example, on a rear surface of the plate 110. Heat may be transferred from the plate 110 to the plurality of first heat dissipation fins 120 through heat conduction.

Thus, the heat generated from the heat generation element 13 may be transferred to the first heat dissipation fins 120 through the plate 110. The heat transferred to the first heat dissipation fins 120 can be cooled through forced convection or natural convection.

Meanwhile, the plurality of first heat dissipation fins 120 may be disposed in a first direction on the one surface of the plate 110 spaced apart from the circuit board 12. Here, the first direction refers to a height direction of the plate 110 and is the Z-axis direction in FIGS. 1 to 4.

Each of the plurality of first heat dissipation fins 120 may extend in a second direction perpendicular to the first direction on the one surface of the plate 110. Here, the second direction refers to a width direction of the plate 110 and is the Y-axis direction in FIGS. 1 to 4.

When the first heat dissipation fins 120 extend in the second direction, a traveling path of air flowing between the first heat dissipation fins 120 becomes shorter than that in a case in which the first heat dissipation fins 120 extend in the first direction. This makes it possible for the first heat dissipation fins 120 to be cooled with air at a relatively low temperature over the entire region of the first heat dissipation fin 120. This can improve the cooling effect through the first heat dissipation fins 120.

However, a shape of the first heat dissipation fin 120 of the present disclosure is not limited thereto. For example, the first heat dissipation fin 120 may have a shape inclined upward from a center of the first heat dissipation fin 120 in the second direction, that is, a 'V' shape, or may have an inclined shape as a whole.

Referring to FIG. 5, a space between two adjacent first heat dissipation fins 120 may define a side flow path S. The side flow path S may be formed between each of the plurality of first heat dissipation fins 120 in the first direction.

A shape of the side flow path S may vary depending on the shape of the first heat dissipation fin 120. For example, when the first heat dissipation fin 120 extends in the second direction, the side flow path S may also extend in the second direction. In this case, the side flow path S may guide air discharged from at least one fan 136 in the second direction.

When the first heat dissipation fin 120 has the inclined shape, the side flow path S may also have an inclined shape. In this case, the side flow path S may guide the air discharged from the at least one fan 136 in an inclined direction.

Referring back to FIGS. 1 to 4, the plurality of first heat dissipation fins 120 may have the same height and may be disposed at the same intervals. However, the present disclosure is not limited thereto, and the height or interval of the first heat dissipation fins 120 may be set differently in order to increase heat dissipation efficiency.

For example, the first heat dissipation fins 120 disposed adjacent to a heat generation element generating a relatively large amount of heat and the first heat dissipation fins 120 disposed adjacent to a heat generation element generating a relatively small amount of heat may have differently set heights or intervals.

The blowing unit 130 may be disposed to face the one surface of the plate 110. More specifically, the blowing unit 130 may be disposed behind the plurality of first heat dissipation fins 120.

The blowing unit 130 may include at least one fan 136. The at least one fan 136 may discharge air toward the one surface of the plate 110. The air discharged from the fan 136 may flow through a region around the first heat dissipation fin 120, such as the side flow path S, and then, be discharged to the outside of the antenna assembly 10. This makes it possible for the heat transferred to the plurality of first heat dissipation fins 120 to be cooled through forced convection.

A traveling direction of the air discharged from the fan 136 may be parallel to a third direction perpendicular to the first direction and the second direction, but the present disclosure is not limited thereto. Here, the third direction refers to a thickness direction of the plate 110, and is the X-axis direction in FIGS. 1 to 4.

The blowing unit 130 may include a plurality of fans 136 disposed in the first direction to evenly cool the plurality of first heat dissipation fins 120 disposed in the first direction.

The blowing unit 130 may be disposed to face a middle region of the plate 110 in the second direction. However, the present disclosure is not limited thereto, and the blowing unit 130 may be disposed to be biased toward one side.

An operation of the fan 136, a rotational speed of the fan 136, and the like may be adjusted through a fan control unit (not illustrated) included within the antenna assembly 10. The fan control unit may control the at least one fan 136 based on information on a surrounding environment, an operating state of the antenna assembly 10, temperature information of the heat generation element 13, and the like.

Here, the operation of the fan 136, the rotational speed of the fan 136, and the like may be automatically adjusted through the fan control unit, or may be adjusted through a manual operation of a user.

The blowing unit 130 may additionally include a fan housing 132 and a fan cover 134.

The fan 136 may be accommodated in the fan housing 132 so that the fan 136 can be protected from an external shock or inflow of foreign substances.

An open rear surface of the fan housing 132 may be covered with the fan cover 134. The fan cover 134 may include a plurality of grills 1342 for protecting the at least one fan 136.

The antenna assembly 10 may additionally include a duct unit 140.

The duct unit 140 may be disposed to cover at least some of the plurality of first heat dissipation fins 120, and may close at least one side of the side flow path S. This makes it possible for the duct unit 140 to prevent the air discharged from the at least one fan 136 from flowing out in an unintended direction, such as to the rear of the antenna assembly 10.

The duct unit 140 may include a first duct 142, and a second duct 144 spaced apart from the first duct 142 in the second direction.

The blowing unit 130 may be disposed between the first duct 142 and the second duct 144. In other words, the first duct 142 and the second duct 144 may be disposed on both sides of the blowing unit 130 in the second direction.

The duct unit 140 may additionally include a plurality of duct fins 146 disposed in the second direction on the first duct 142 and the second duct 144. Each duct fin 146 may extend in the first direction on the first duct 142 and the second duct 144.

The plurality of duct fins 146 may be exposed to the outside of the antenna assembly 10 and can be cooled by natural convection. This makes it possible for at least some of the heat transferred to the plurality of first heat dissipation fins 120 to be cooled through the plurality of duct fins 146.

Meanwhile, a case in which the heat dissipation apparatus 100 according to the embodiment of the present disclosure is applied to the antenna assembly 10 has been shown in FIGS. 1 to 4, but this is merely for convenience of description and the present disclosure is limited thereto. Accordingly, the heat dissipation apparatus 100 according to the embodiment of the present disclosure may be applied to other devices including a heat generation element, other than the antenna assembly 10.

Second to fourth embodiments of the present disclosure illustrated in FIGS. 6 and 10 to be described below differ from the embodiment of the present disclosure illustrated in FIGS. 1 to 5 in that the first heat dissipation fins are configured as a pair of side heat dissipation fins, and an intermediate flow path is formed between the pair of heat dissipation fins. Hereinafter, distinguishing characteristics of each embodiment of the present disclosure will be mainly described, and repeated description of substantially the same configuration as that in the embodiment of the present disclosure will be omitted.

Figure 6:
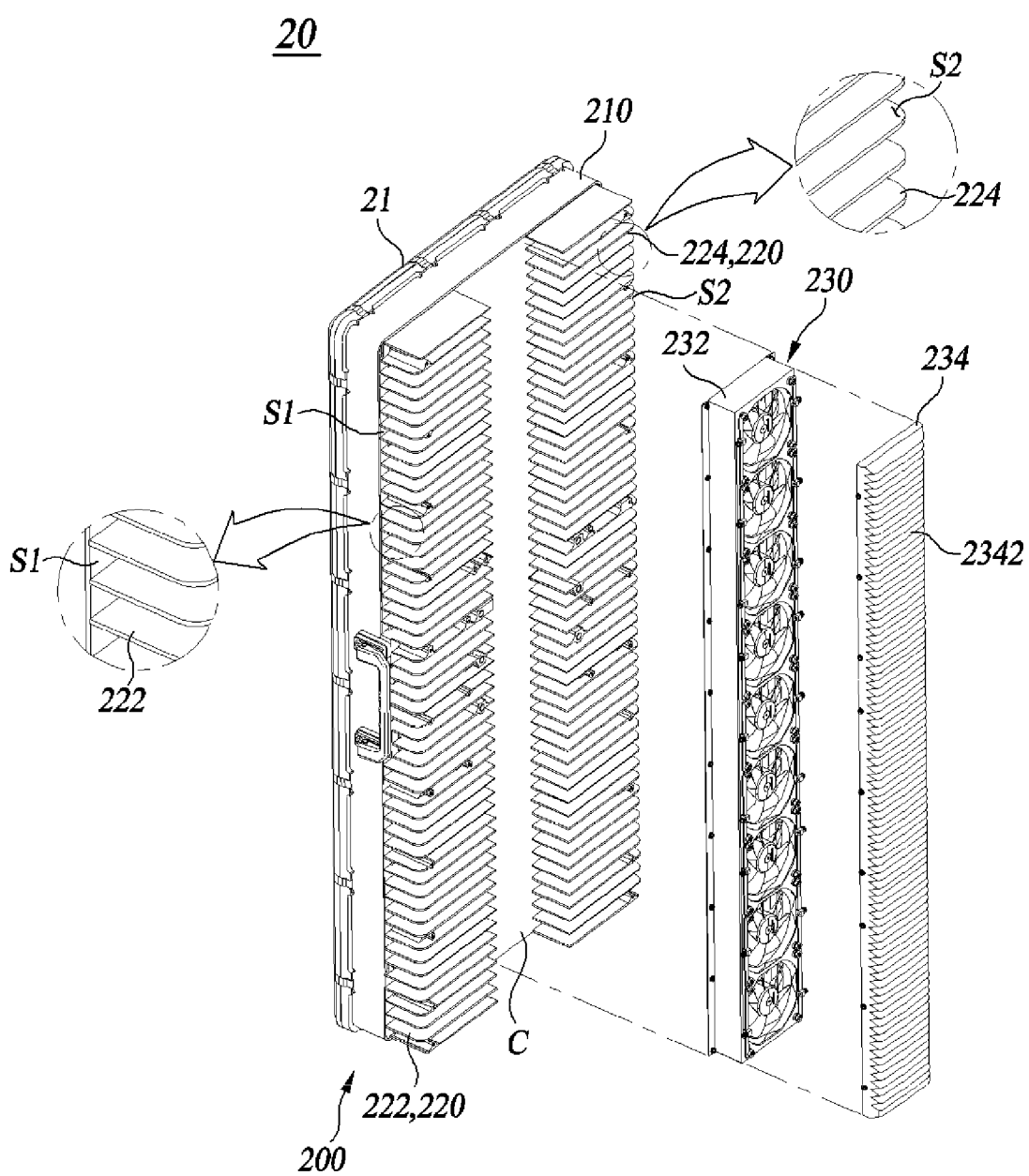
FIG. 6 is a rear exploded perspective view of an antenna assembly according to a second embodiment of the present disclosure.

FIG. 6 is a rear exploded perspective view of an antenna assembly 20 according to the second embodiment of the present disclosure.

Figure 7:
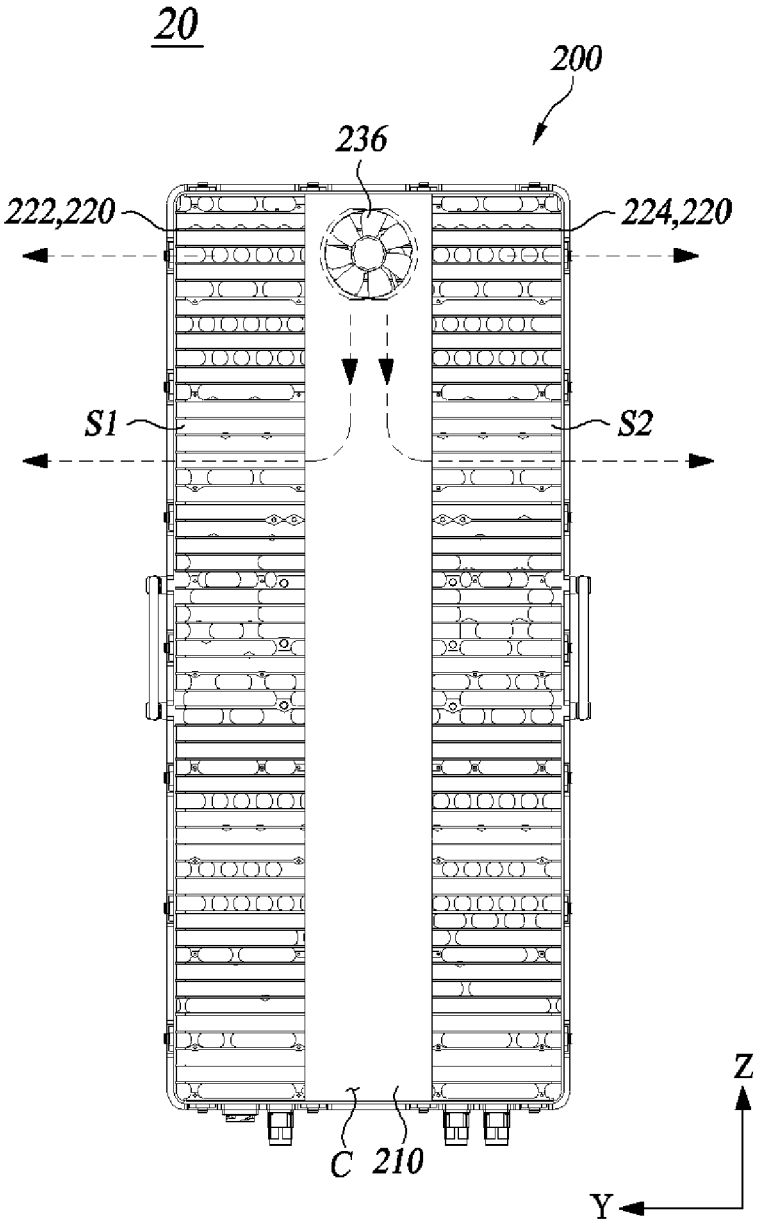
FIG. 7 is a rear view of the antenna assembly according to the second embodiment of the present disclosure.

FIG. 7 is a rear view of the antenna assembly 20 according to the second embodiment of the present disclosure. For convenience of description, a blowing unit and a duct unit are omitted in FIG. 7.

Referring to FIGS. 6 and 7, a plurality of first heat dissipation fins 220 may include a plurality of first side heat dissipation fins 222 and a plurality of second side heat dissipation fins 224.

The plurality of first side heat dissipation fins 222 and the plurality of second side heat dissipation fins 224 may be disposed in the first direction. The plurality of first side heat dissipation fins 222 and the plurality of second side heat dissipation fins 224 may be spaced apart from each other in the second direction.

The first side heat dissipation fins 222 and the second side heat dissipation fins 224 may extend in the second direction. However, the present disclosure is not limited thereto, and the first side heat dissipation fins 222 and the second side heat dissipation fins 224 may have an inclined shape.

A space between two adjacent first side heat dissipation fins 222 may define a first side flow path S1. The first side flow path S1 may be formed between the plurality of first side heat dissipation fins 222 in the first direction.

A space between two adjacent second side heat dissipation fins 224 may define a second side flow path S2. The second side flow path S2 may be formed between the plurality of second side heat dissipation fins 224 in the first direction.

The first side flow path S1 and the second side flow path S2 may guide the air discharged from the at least one fan 236.

The shapes of the side flow paths S1 and S2 may vary depending on shapes of the side heat dissipation fins 222 and 224. For example, when the side heat dissipation fins 222 and 224 extend in the second direction, the side flow paths S1 and S2 may also extend in the second direction. In this case, the side flow paths S1 and S2 may guide the air discharged from the at least one fan 236 in the second direction.

When the side heat dissipation fins 222 and 224 have an inclined shape, the side flow paths S1 and S2 may also have an inclined shape. In this case, the side flow paths S1 and S2 may guide the air discharged from the at least one fan 236 in an inclined direction.

A space between the plurality of first side heat dissipation fins 222 and the plurality of second side heat dissipation fins 224 may define an intermediate flow path C.

The intermediate flow path C may guide the air discharged from the at least one fan 236 in the first direction. The air discharged from the fan 236 may cool the one surface of the plate 210 while flowing in the first direction along the intermediate flow path C.

The intermediate flow path C may communicate with the first side flow path S1 and the second side flow path S2. This makes it possible for the air discharged from the fan 236 to pass through the intermediate flow path C and be transferred to the first side flow path S1 and the second side flow path S2.

The air discharged from the one fan 236 may be transferred to not only the side heat dissipation fins 222 and 224 at positions corresponding to the fan 236, but also the side heat dissipation fins 222 and 224 at positions spaced slightly apart from the fan 236 through the intermediate flow path C.

Accordingly, even when a failure occurs in any one of the plurality of fans 236, it is possible to cool the side heat dissipation fins 222 and 224 corresponding to the fan 236 through another fan 236.

Thus, the heat dissipation apparatus 200 according to the second embodiment of the present disclosure can have a redundancy function capable of cooling the side heat dissipation fins 222 and 224 through the other fan 236 even when a failure occurs in some of the plurality of fans 236.

Figure 8:
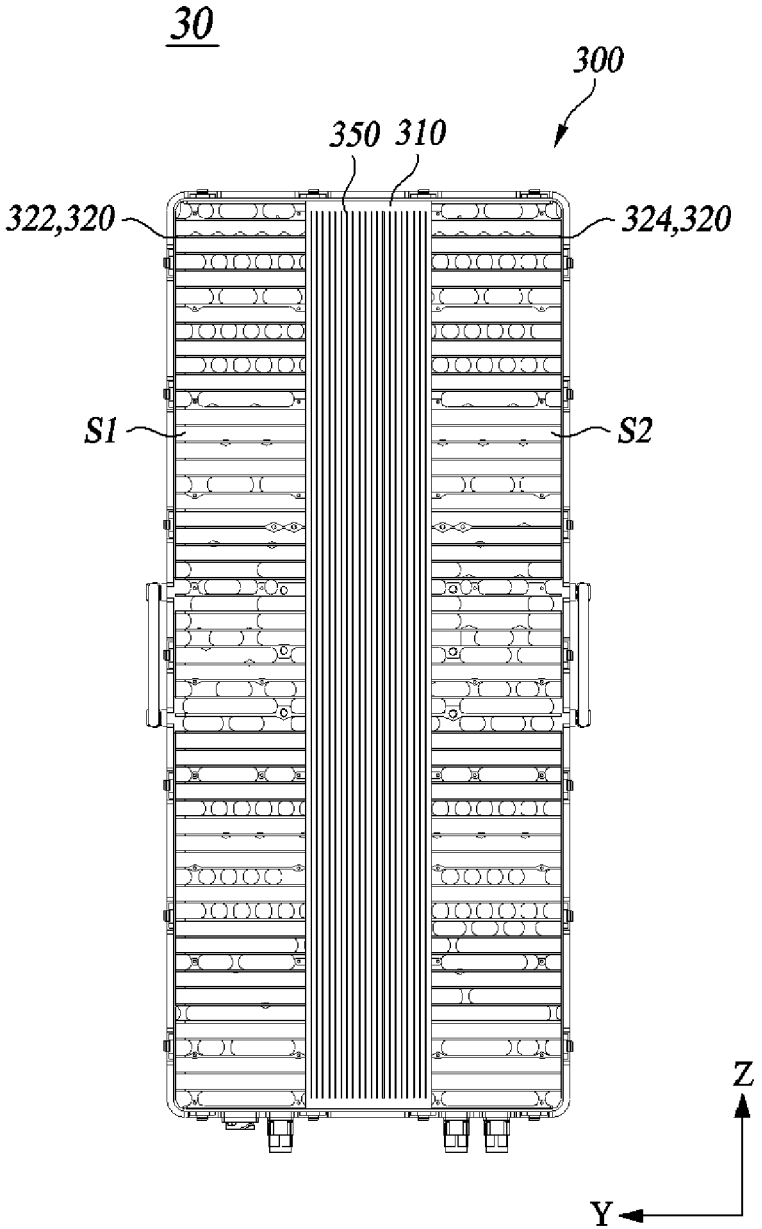
FIG. 8 is a rear view of an antenna assembly according to a third embodiment of the present disclosure.

FIG. 8 is a rear view of an antenna assembly 30 according to a third embodiment of the present disclosure.

Figure 9:
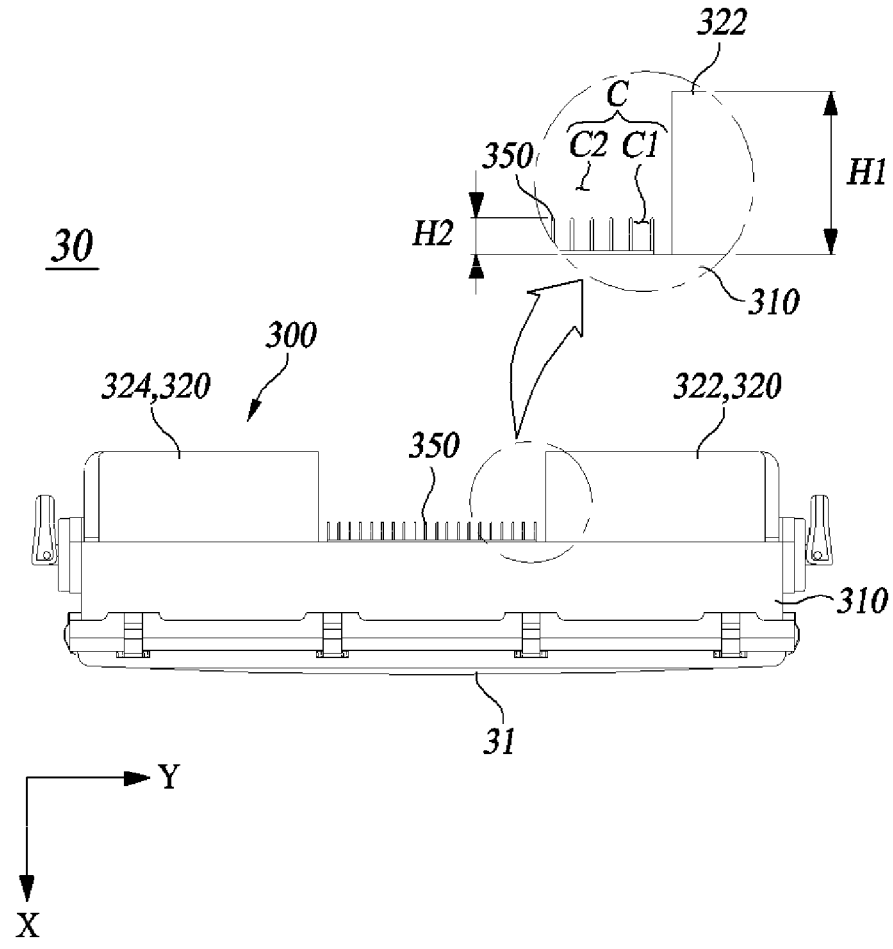
FIG. 9 is a bottom view of the antenna assembly according to the third embodiment of the present disclosure.

FIG. 9 is a bottom view of the antenna assembly 30 according to the third embodiment of the present disclosure.

For convenience of description, the blowing unit and the duct unit are omitted in FIGS. 8 and 9.

Referring to FIGS. 8 and 9, a plurality of first heat dissipation fins 320 may include a plurality of first side heat dissipation fins 322 and a plurality of second side heat dissipation fins 324.

The plurality of first side heat dissipation fins 322 and the plurality of second side heat dissipation fins 324 may be disposed in the first direction. The plurality of first side heat dissipation fins 322 and the plurality of second side heat dissipation fins 324 may be spaced apart from each other in the second direction.

The first side heat dissipation fins 322 and the second side heat dissipation fins 324 may extend in the second direction. However, the present disclosure is not limited thereto, and the first side heat dissipation fin 322 and the second side heat dissipation fin 324 may have an inclined shape.

A space between two adjacent first side heat dissipation fins 322 may define a first side flow path S1. The first side flow path S1 may be formed between the plurality of first side heat dissipation fins 322 in the first direction.

A space between two adjacent second side heat dissipation fins 324 may define a second side flow path S2. The second side flow path S2 may be formed between the plurality of second side heat dissipation fins 324 in the first direction.

The first side flow path S1 and the second side flow path S2 may guide the air discharged from at least one fan 336.

A space between the plurality of first side heat dissipation fins 322 and the plurality of second side heat dissipation fins 324 may define an intermediate flow path C.

The intermediate flow path C may guide the air discharged from the at least one fan 336 in the first direction. The air discharged from the fan 336 may cool one surface of the plate 310 while flowing in the first direction along the intermediate flow path C.

The intermediate flow path C may communicate with the first side flow path S1 and the second side flow path S2. This makes it possible for the air discharged from the fan 336 to pass through the intermediate flow path C and be transferred to the first side flow path S1 and the second side flow path S2.

The heat dissipation apparatus 300 may include a plurality of second heat dissipation fins 350 disposed between the plurality of first side heat dissipation fins 322 and the plurality of second side heat dissipation fins 324.

The plurality of second heat dissipation fins 350 may be disposed in the second direction, and each second heat dissipation fin 350 may extend in the first direction. The heat generated from the heat generation element may pass through the plate 310 and be transferred to the second heat dissipation fins 350. The heat transferred to the second heat dissipation fins 350 can be cooled by forced convection or natural convection.

The plurality of first side heat dissipation fins 322 and the plurality of second side heat dissipation fins 324 may have a first height H1, and the plurality of second heat dissipation fins 350 may have a second height H2 smaller than the first height. Here, the first height H1 and the second height H2 are defined with reference to the one surface of the plate 310.

By setting the height H2 of the second heat dissipation fin 350 to be smaller than the height H1 of the side heat dissipation fins 322 and 324, it is possible to prevent air flow from the intermediate flow path C to the side flow paths S1 and S2 from being hindered by the second heat dissipation fins 350.

The intermediate flow path C may include a plurality of sub flow paths C1 and a main flow path C2.

The plurality of sub flow paths C1 is defined as a space between two adjacent second heat dissipation fins 350, and the main flow path C2 is defined as a space between the side heat dissipation fins 322 and 324 on the second heat dissipation fins 350.

The main flow path C2 may communicate with the plurality of sub flow paths C1. The air discharged from the fan may be guided along the main flow path C2, and the air guided by the main flow path C2 may be transferred to the side flow paths S1 and S2. This makes it possible to implement a redundancy function.

Meanwhile, at least some of the air flowing through the intermediate flow path C can be guided along the plurality of sub flow paths C1, and the air guided by the plurality of sub flow paths C1 can cool the second heat dissipation fins 350.

Thus, the heat dissipation apparatus 300 according to the third embodiment of the present disclosure has advantages that a redundancy function can be implemented through the sub flow paths C1 and the main flow path C2, and an additional heat dissipation effect through the second heat dissipation fins 350 can be achieved.

Figure 10:
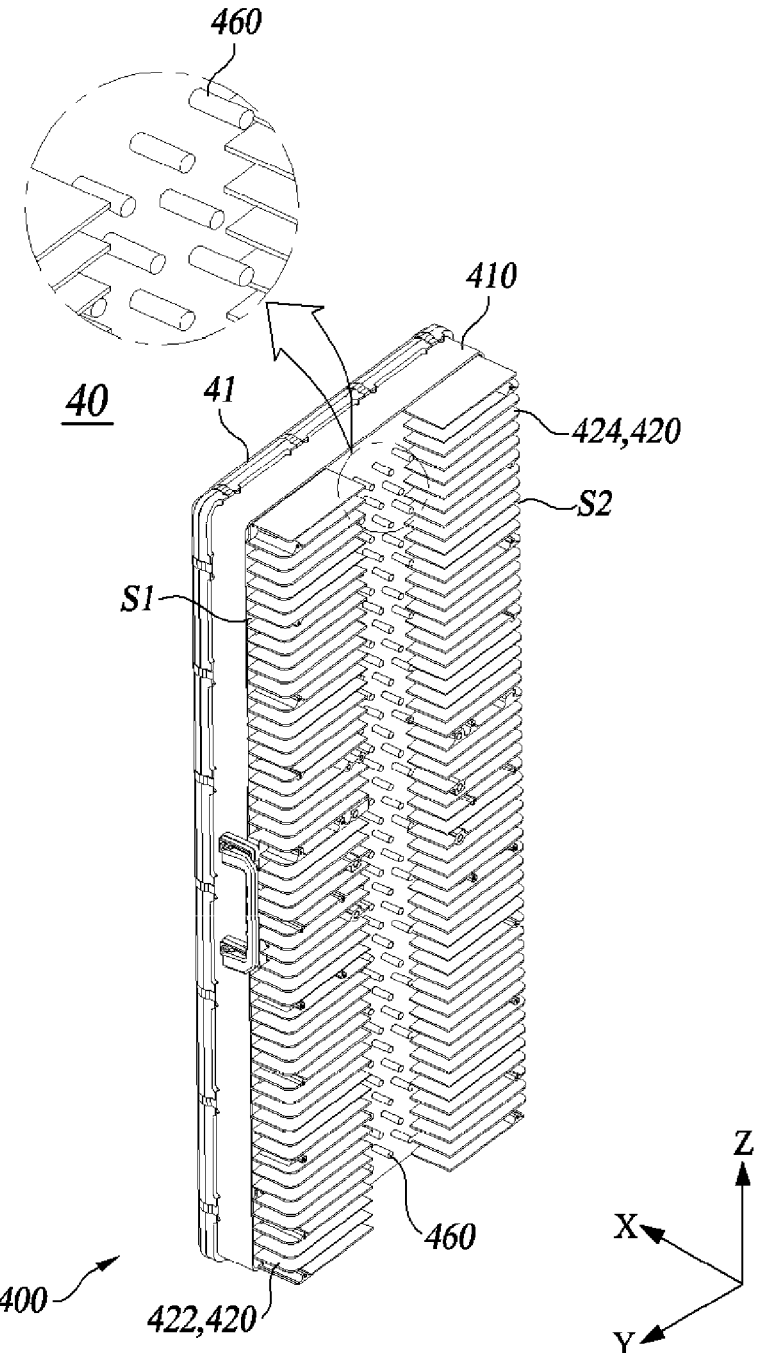
FIG. 10 is a rear perspective view of an antenna assembly according to a fourth embodiment of the present disclosure.

FIG. 10 is a rear perspective view of an antenna assembly 40 according to a fourth embodiment of the present disclosure. For convenience of description, the blowing unit and the duct unit are omitted in FIG. 10.

Referring to FIG. 10, a heat dissipation apparatus 400 may include a plurality of protrusions 460 protruding from one surface of a plate 410. The plurality of protrusions 460 may be disposed between a plurality of first side heat dissipation fins 422 and a plurality of second side heat dissipation fins 424.

Air discharged from the at least one fan may collide with the plurality of protrusions 460 while flowing through the intermediate flow path C. In this case, turbulence may occur inside the air flowing through the intermediate flow path C. Such turbulence can promote convective cooling. This makes it possible for the air flowing through the intermediate flow path C to more effectively cool the plate 410.

Furthermore, heat may be transferred from the plate 410 to the plurality of protrusions 460 through heat conduction. Accordingly, the heat transferred to the plurality of protrusions 460 can be cooled by the air flowing through the intermediate flow path C.

A fifth embodiment of the present disclosure illustrated in FIG. 11, which will be described below, differs from the embodiment of the present disclosure illustrated in FIGS. 1 to 5 in that a blowing unit includes two types of alternately disposed fans having rotational directions opposite from each other. Hereinafter, distinguishing characteristics of the fifth embodiment of the present disclosure will be mainly described, and repeated description of substantially the same configuration as that in the embodiment of the present disclosure will be omitted.

Figure 11:
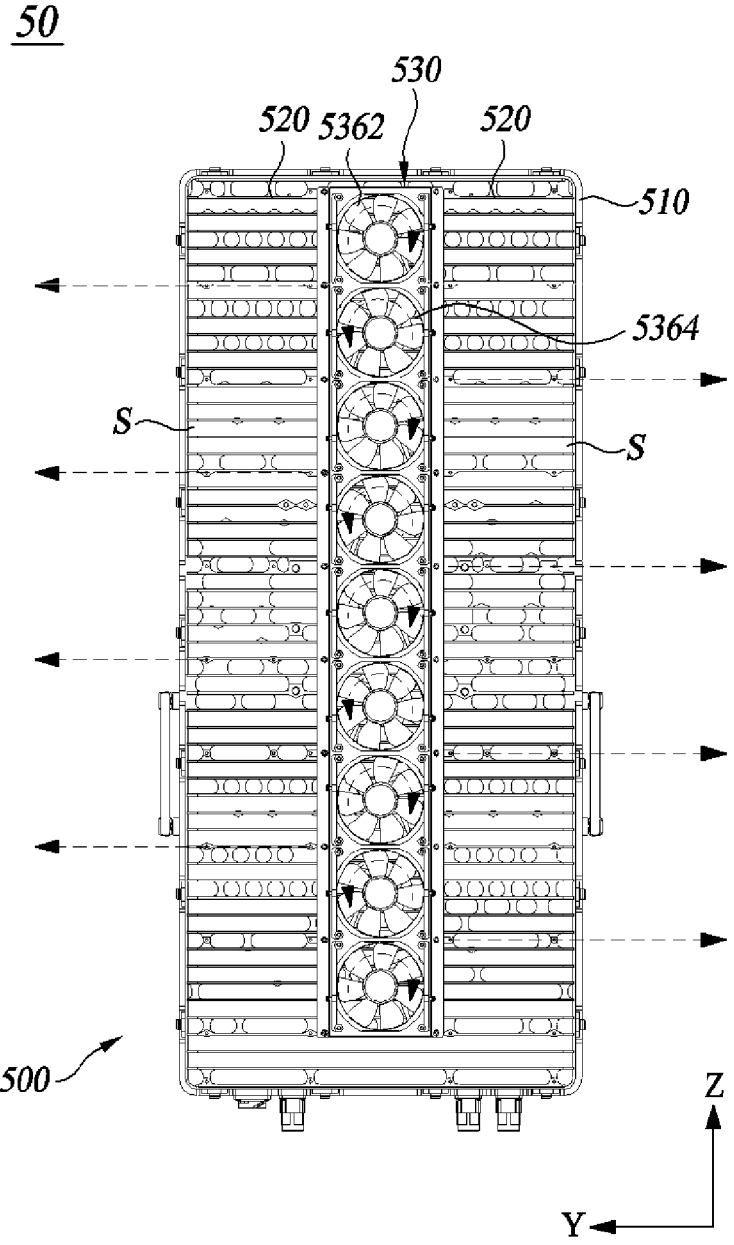
FIG. 11 is a rear view of an antenna assembly according to a fifth embodiment of the present disclosure.

FIG. 11 is a rear view of the antenna assembly 50 according to the fifth embodiment of the present disclosure. For convenience of description, the duct unit is omitted in FIG. 11.

Referring to FIG. 11, a blowing unit 530 may include a plurality of first fans 5362 rotating in a first rotational direction, and a plurality of second fans 5364 rotating in a second rotational direction opposite to the first rotational direction.

For example, when the first fan 5362 rotates clockwise, the second fan 5364 may rotate counterclockwise. Conversely, when the first fan 5362 rotates counterclockwise, the second fan 5364 may rotate clockwise.

The first fans 5362 and the second fans 5364 may be alternately disposed in the first direction. In this case, it is possible to minimize a degree to which air is offset in a region between two adjacent fans.

For example, a lower region in the first fan 5362 rotating clockwise generates air flowing to the left, and an upper region in the second fan 5364 rotating counterclockwise generates air flowing to the left.

In other words, flow directions of the air may align in a region between the first fan 5362 and the second fan 5364 adjacent thereto. In this case, a degree to which air generated in the region between the two fans 5362 and 5364 is offset may be reduced compared to a case in which the two adjacent fans rotate in the same direction.

Further, a flow rate of the air discharged from the region between the two fans 5362 and 5364 may be increased as the degree to which air is offset is reduced. This can improve a cooling effect of the first heat dissipation fins 520 through the forced convection from the plurality of fans 536.

A sixth embodiment of the present disclosure illustrated in FIG. 12, which will be described below, differs from the embodiment of the present disclosure illustrated in FIGS. 1 to 5 in that the blowing unit includes a plurality of fan columns. Hereinafter, distinguishing characteristics of the sixth embodiment of the present disclosure will be mainly described, and repeated description of substantially the same configuration as that in the embodiment of the present disclosure will be omitted.

Figure 12:
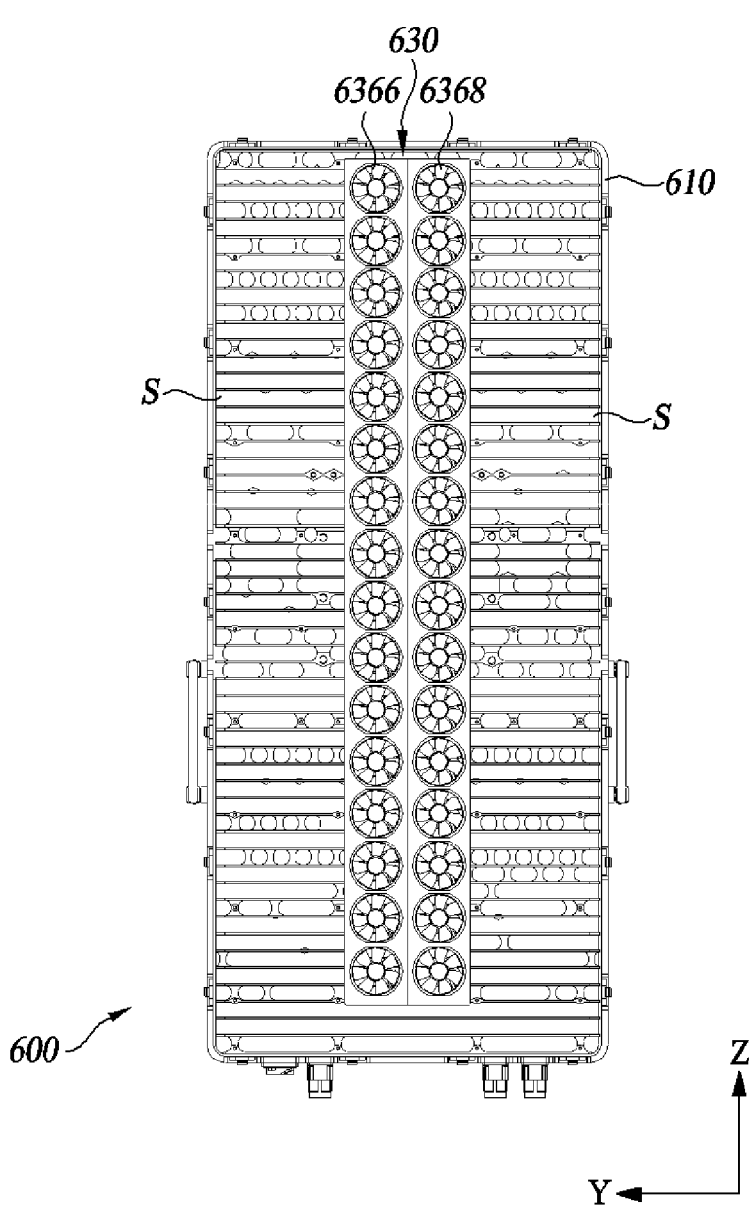
FIG. 12 is a rear view of an antenna assembly according to a sixth embodiment of the present disclosure.

FIG. 12 is a rear view of an antenna assembly 60 according to a sixth embodiment of the present disclosure. For convenience of description, the duct unit is omitted in FIG. 12.

Referring to FIG. 12, a blowing unit 630 may include a plurality of third fans 6366 disposed in the first direction and a plurality of fourth fans 6368 disposed in the first direction.

The plurality of third fans 6366 and the plurality of fourth fans 6368 may be disposed adjacent to each other in the second direction. In other words, the blowing unit 630 may include a plurality of fan columns. In this case, even when any one of the fans fails, a first heat dissipation fin 620 corresponding to the fan can be cooled through another fan adjacent to the fan in the second direction. That is, a redundancy function can be implemented.

Meanwhile, the fans 6366 and 6368 in the blowing unit 630 may have a slightly small size so that a plurality of fans can be disposed in a limited space. In this case, the number of fans disposed in one fan column may also be increased, thereby further improving the redundancy function. However, the present disclosure is not limited thereto, and the blowing unit 630 may include medium-sized or large-sized fans.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. A heat dissipation apparatus configured to cool a circuit board including at least one heat generation element, the heat dissipation apparatus comprising:

a plate facing the circuit board;

a plurality of first heat dissipation fins arranged along a first direction on one surface of the plate spaced apart from the circuit board; and a blowing unit facing the one surface of the plate, the blowing unit including at least one fan configured to discharge air toward the one surface of the plate, wherein a space between two adjacent first heat dissipation fins forms a side flow path configured to guide the air discharged from the at least one fan, wherein the heat dissipation apparatus further comprises a duct unit covering at least some of the plurality of first heat dissipation fins and closing at least a part of one side, which is located opposite to the plate, of the side flow path, and wherein the duct unit includes a first duct, and a second duct spaced apart from the first duct, wherein the first duct and the second duct are arranged along a second direction perpendicular to the first direction on the one surface of the plate, the first duct comprises a first plurality of duct fins and the second duct comprises a second plurality of duct fins, the first plurality of duct fins and the second plurality of duct fins are exposed to outside of the apparatus, wherein each of the first plurality of duct fins and the second plurality of duct fins is disposed crossing perpendicular to the plurality of first heat dissipation fins, and wherein the blowing unit is disposed in an interspace between the first duct and the second duct.

2. The heat dissipation apparatus of claim 1, wherein each of the plurality of first heat dissipation fins extends in the second direction on the one surface of the plate, and the side flow path is configured to guide the air discharged from the at least one fan in the second direction.

3. The heat dissipation apparatus of claim 1, wherein the plurality of first heat dissipation fins includes a plurality of first side heat dissipation fins disposed in the first direction, and a plurality of second side heat dissipation fins disposed in the first direction and spaced apart from the first side heat dissipation fins in the second direction, a space between two adjacent first side heat dissipation fins forms a first side flow path configured to guide the air discharged from the at least one fan, and a space between two adjacent second side heat dissipation fins forms a second side flow path configured to guide the air discharged from the at least one fan.

4. The heat dissipation apparatus of claim 3, wherein a space between the plurality of first side heat dissipation fins and the plurality of second side heat dissipation fins forms an intermediate flow path communicating with the first side flow path and the second side flow path, and the intermediate flow path is configured to guide the air discharged from the at least one fan in the first direction.

5. The heat dissipation apparatus of claim 4, further comprising:

a plurality of second heat dissipation fins disposed in the second direction between the plurality of first side heat dissipation fins and the plurality of second side heat dissipation fins, wherein each of the plurality of second heat dissipation fins extends in the first direction.

6. The heat dissipation apparatus of claim 5, wherein the plurality of first side heat dissipation fins and the plurality of second side heat dissipation fins have a first height, and the plurality of second heat dissipation fins have a second height smaller than the first height.

7. The heat dissipation apparatus of claim 6, wherein the intermediate flow path includes a plurality of sub flow paths each formed as a space between two adjacent second heat dissipation fins, and a main flow path communicating with the plurality of sub flow paths.

8. The heat dissipation apparatus of claim 3, further comprising:

a plurality of protrusions protruding from the one surface of the plate between the plurality of first side heat dissipation fins and the plurality of second side heat dissipation fins.

9. The heat dissipation apparatus of claim 1, wherein the blowing unit includes a plurality of fans arranged along the first direction.

10. The heat dissipation apparatus of claim 9, wherein the blowing unit includes a plurality of first fans rotating in a first rotational direction, and a plurality of second fans rotating in a second rotational direction opposite to the first rotational direction, and the first fans and the second fans are alternately disposed in the first direction.

11. The heat dissipation apparatus of claim 1, wherein the blowing unit includes a plurality of third fans disposed in the first direction, and a plurality of fourth fans disposed in the first direction, and the plurality of third fans and the plurality of fourth fans are disposed adjacent to each other in a second direction perpendicular to the first direction.

12. An antenna assembly comprising:

the heat dissipation apparatus according to claim 1; and the circuit board including the at least one heat generation element.

13. The antenna assembly of claim 12, wherein the heat generation element includes an RF element.

14. The heat dissipation apparatus of claim 1, wherein the blowing unit includes:

a plurality of first fans rotating in a first rotational direction; and a plurality of second fans rotating in a second rotational direction opposite to the first rotational direction, wherein the first fans and the second fans are alternately disposed in the first direction.

15. The heat dissipation apparatus of claim 14, wherein:

the first fans are configured to rotate clockwise and the second fans are configured to rotate counterclockwise.

16. The heat dissipation apparatus of claim 1, wherein:

the blowing unit is positioned at one ends of the plurality of first heat dissipation fins in an extension direction thereof.

17. The heat dissipation apparatus of claim 1, wherein:

the blowing unit is disposed crossing the plurality of first heat dissipation fins and protrudes in a third direction perpendicular to both the first direction and the second direction.

* * * * *